United States Patent
Ando et al.

(10) Patent No.: US 10,734,447 B2
(45) Date of Patent: Aug. 4, 2020

(54) FIELD-EFFECT TRANSISTOR UNIT CELLS FOR NEURAL NETWORKS WITH DIFFERENTIAL WEIGHTS

(71) Applicant: International Business Machines Corporation, Armonk, NY (US)

(72) Inventors: Takashi Ando, Tuckahoe, NY (US); Pouya Hashemi, White Plains, NY (US); Alexander Reznicek, Troy, NY (US); Choonghyun Lee, Rensselaer, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 18 days.

(21) Appl. No.: 16/167,099

(22) Filed: Oct. 22, 2018

(65) Prior Publication Data
US 2020/0127054 A1    Apr. 23, 2020

(51) Int. Cl.
*H01L 27/24* (2006.01)
*H01L 45/00* (2006.01)
*G06N 3/063* (2006.01)

(52) U.S. Cl.
CPC ......... *H01L 27/2481* (2013.01); *G06N 3/063* (2013.01); *H01L 27/249* (2013.01); *H01L 45/1233* (2013.01); *H01L 45/1608* (2013.01); *H01L 45/1683* (2013.01)

(58) Field of Classification Search
CPC ............... H01L 27/249; H01L 27/2481; H01L 45/1233; H01L 45/1608; H01L 45/1683; G06N 3/063
See application file for complete search history.

(56) References Cited

U.S. PATENT DOCUMENTS

| | | | |
|---|---|---|---|
| 9,224,946 B2 | 12/2015 | Kim et al. | |
| 9,368,207 B2 | 6/2016 | Bandyopadhyay et al. | |
| 9,397,291 B1 | 7/2016 | Jo | |
| 9,806,255 B1 | 10/2017 | Hsu et al. | |
| 10,128,852 B2 * | 11/2018 | McCollum | H03K 19/0941 |
| 10,153,327 B1 * | 12/2018 | Park | H01L 27/2481 |
| 10,242,737 B1 * | 3/2019 | Lin | H01L 45/16 |
| 10,297,749 B1 * | 5/2019 | Hashemi | G11C 13/0004 |
| 10,504,963 B2 * | 12/2019 | Yang | H01L 45/147 |
| 10,546,633 B2 * | 1/2020 | McCollum | G11C 13/0011 |
| 2008/0080226 A1 | 4/2008 | Mikolajick et al. | |

(Continued)

OTHER PUBLICATIONS

Pan, Hsin, Wei, et al. "1Kbit FinFET Dielectric (FIND) RRAM in pure 16nm FinFET CMOS logic proces" Hsin Wei Pan et al., IEDM2015, p. 257. 4 pages.

(Continued)

*Primary Examiner* — Victoria K. Hall
(74) *Attorney, Agent, or Firm* — Amin, Turocy & Watson, LLP

(57) ABSTRACT

Techniques regarding FET 1T2R unit cells are provided. For example, one or more embodiments described herein can comprise a system, which can comprise a first resistive random-access memory unit operably coupled to a field-effect transistor by a first extrinsic semiconductor layer. The system can also comprise a second resistive random-access memory unit operably coupled to the field-effect transistor by a second extrinsic semiconductor layer.

19 Claims, 11 Drawing Sheets

(56) References Cited

U.S. PATENT DOCUMENTS

| | | | | |
|---|---|---|---|---|
| 2008/0239799 | A1* | 10/2008 | Watanabe | G11C 13/0004 365/163 |
| 2009/0224224 | A1* | 9/2009 | Fujii | G11C 13/0007 257/2 |
| 2009/0225580 | A1* | 9/2009 | Wang | G11C 7/18 365/63 |
| 2010/0032637 | A1* | 2/2010 | Kinoshita | G11C 11/5678 257/2 |
| 2010/0127235 | A1* | 5/2010 | Tsukamoto | B82Y 10/00 257/5 |
| 2011/0075469 | A1* | 3/2011 | Wei | G11C 11/5685 365/148 |
| 2012/0049148 | A1* | 3/2012 | Fukano | H01L 27/2454 257/5 |
| 2012/0236625 | A1* | 9/2012 | Ohba | H01L 27/2436 365/148 |
| 2012/0256156 | A1* | 10/2012 | Arita | G11C 13/0007 257/4 |
| 2013/0044531 | A1* | 2/2013 | Baek | G11O 5/025 365/72 |
| 2013/0285006 | A1* | 10/2013 | Park | H01L 45/1206 257/5 |
| 2014/0268989 | A1* | 9/2014 | Hong | G11C 13/0002 365/148 |
| 2015/0221865 | A1* | 8/2015 | Tada | H01L 27/101 257/4 |
| 2016/0181385 | A1* | 6/2016 | Kim | H01L 29/66621 257/4 |
| 2016/0351623 | A1 | 12/2016 | Chen et al. | |
| 2017/0110554 | A1* | 4/2017 | Tak | H01L 29/4991 |
| 2017/0271407 | A1 | 9/2017 | Shepard | |
| 2018/0018559 | A1 | 1/2018 | Yakopcic et al. | |
| 2018/0083212 | A1 | 3/2018 | Yoon et al. | |
| 2018/0138200 | A1* | 5/2018 | Kim | H01L 27/11807 |
| 2018/0138401 | A1 | 5/2018 | Ando et al. | |
| 2019/0057903 | A1* | 2/2019 | Or-Bach | H01L 27/11206 |
| 2019/0067373 | A1* | 2/2019 | Yang | H01L 45/08 |
| 2019/0131394 | A1* | 5/2019 | Reznicek | H01L 21/823871 |
| 2019/0393307 | A1* | 12/2019 | Reznicek | H01L 29/66545 |
| 2020/0006426 | A1* | 1/2020 | Ando | H01L 45/146 |
| 2020/0006479 | A1* | 1/2020 | Reznicek | H01L 27/092 |

OTHER PUBLICATIONS

Burr, Geoffrey W., et al., "Experimental demonstration and tolerancing of a large-scale neural network (165 000 synapses) using phase-change memory as the synaptic weight element" IEEE Transactions on Electron Devices, vol. 62, 3498-3507 (2015). 9 pages.

Gokmen, Tayfun, et al. "Acceleration of Deep Neural Network Training with Resistive Cross-Point Devices: Design Considerations." Front. Neurosci., Jul. 21, 2016. 13 pages.

Nauenheim, C., et al. "Integration of TiO2 into Nano-Crossbar Arrays with 100 nm Half Pitch for Resisitve RAM Applications" EMRL Electronic Materials Research Library. http://www.emrl.de/r_a_1/html. Last Accessed Oct. 4, 2018. 6 pages.

"Vertically Stacked NFET and PFET With Dual Work Function" U.S. Appl. No. 15/801,967, filed Nov. 2, 2017.

* cited by examiner

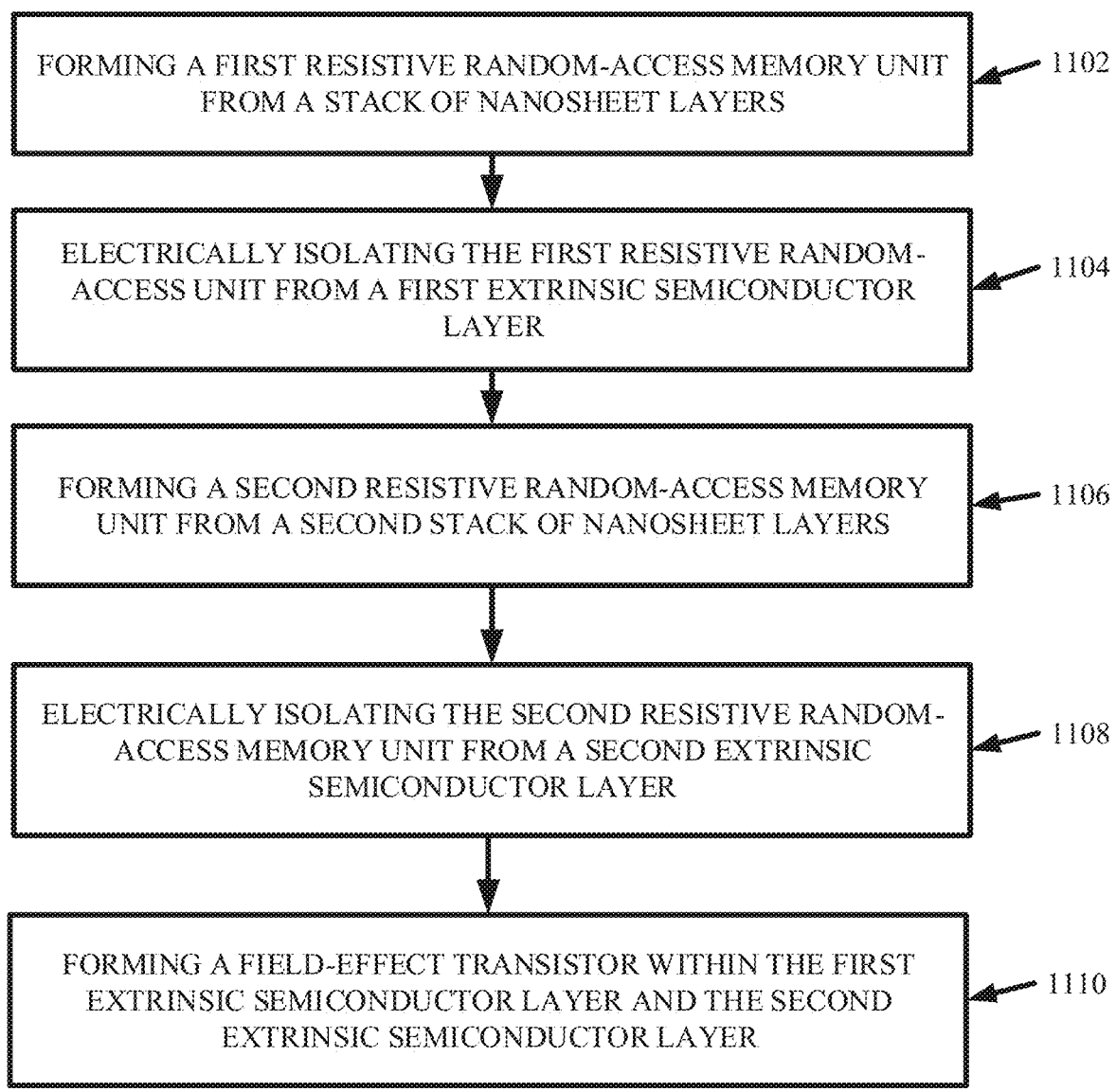

US 10,734,447 B2

FIELD-EFFECT TRANSISTOR UNIT CELLS FOR NEURAL NETWORKS WITH DIFFERENTIAL WEIGHTS

BACKGROUND

The subject disclosure relates to field-effect transistor ("FEY") unit cells for one or more neural networks with differential weights, and more specifically, to FET unit cells comprises a one-transistor/two-resistor ("1T2R") structure.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, apparatuses, and/or methods regarding FET 1T2R unit cells are described.

According to an embodiment, a system is provided. The system can comprise a first resistive random-access memory unit operably coupled to a field-effect transistor by a first extrinsic semiconductor layer. The system can also comprise a second resistive random-access memory unit operably coupled to the field-effect transistor by a second extrinsic semiconductor layer.

According to an embodiment, an apparatus is provided. The apparatus can comprise a first resistive random-access memory unit positioned on a semiconductor substrate and adjacent a first side of a field-effect transistor. The field-effect transistor can control electrical communication between the first resistive random-access memory and a first metal contact. The apparatus can also comprise a second resistive random-access memory unit positioned on the semiconductor substrate and adjacent to a second side of the field-effect transistor. The field-effect transistor can control electrical communication between the second resistive random-access memory and a second metal contact.

According to an embodiment, a method is provided. The method can comprise electrically isolating a first resistive random-access memory unit from a first extrinsic semiconductor layer. The method can also comprise electrically isolating a second resistive random-access memory unit from a second extrinsic semiconductor layer. Further, the method can comprise forming a field-effect transistor within the first extrinsic semiconductor layer and the second extrinsic semiconductor layer.

BRIEF DESCRIPTION OF THE DRAWINGS

FIG. 11 illustrates a flow diagram of an example, non-limiting method that can facilitate manufacturing one or more FET 1T2R unit cells in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, cross-hatching and/or shading can be used throughout the drawings to denote like referenced materials, compositions, and/or features.

ReRAM is a promising technology for electronic synapse devices and/or memristors for neuromorphic computing as well as high-density and/or high-speed non-volatile memory applications. For example, in neuromorphic computing applications, a resistive memory device can be used as a connection (e.g., an artificial synapse) between a pre-neuron and/or a post-neuron (e.g., representing the connection weight within a deep neural network ("DNN") in the form of device resistance). For instance, multiple pre-neurons and/or post-neurons can be connected through a crossbar array of ReRAM devices, thereby expressing a fully connected DNN. For training of the DNN, two unipolar ReRAM devices can be utilized to adjust one or more weights of the DNN, wherein a difference between the resistivity of the two ReRAM devices can express the weight.

Various embodiments described herein can regard one or more structures and/or methods to facilitate controlled filament formation in ReRAM oxides while also enabling the integration of one or more FET 1T2R devices in tight pitch. Thus, one or more embodiments can enable an acceleration of DNN training through tightly scaled FET 1T2R device architecture to represent an artificial synaptic weight. For example, a FET comprised within a FET 1T2R unit cell described herein can independently control currents flowing through two ReRAM units positioned at opposite sides of the FET transistor. Thus, a single FET can control operation of two ReRAM units. Further, the various embodiments described herein can regard FET 1T2R architecture that consumes a minimal amount of space.

Figure 1:
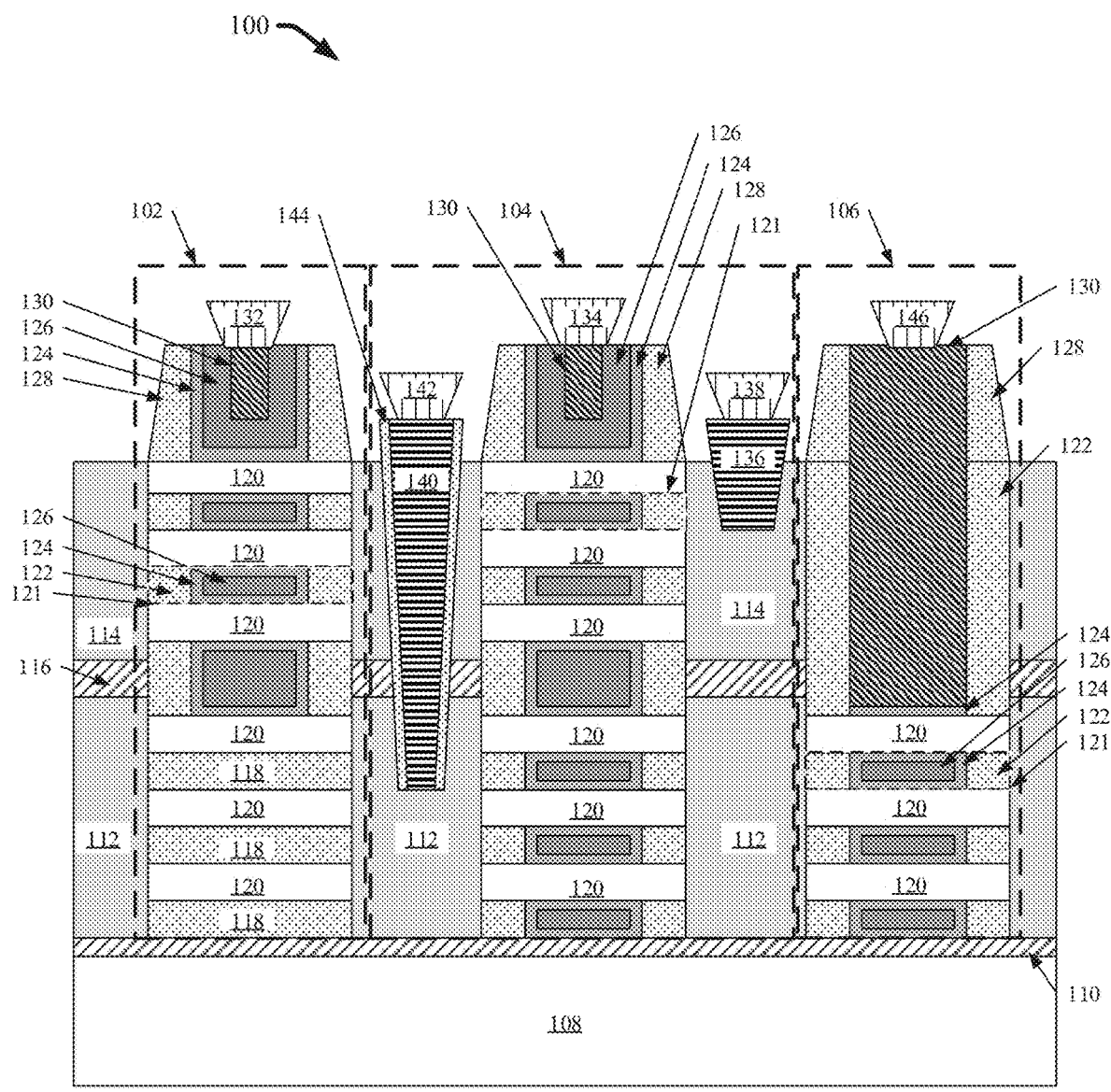
FIG. 1 illustrates a diagram of an example, non-limiting FET 1T2R unit cell that can be used in one or more neuromorphic computing applications in accordance with one or more embodiments described herein.

FIG. 1 illustrates a diagram of an example, non-limiting FET 1T2R unit cell 100 that can comprise a first ReRAM unit 102, a FET 104, and/or a second ReRAM unit 106 (e.g., respectively delineated in FIG. 1 with dashed lines). As shown in FIG. 1, the first ReRAM unit 102, the FET 104, and/or the second ReRAM unit 106 can be positioned on one or more semiconductor substrates 108.

Example materials that can comprise the one or more semiconductor substrates 108 can include, but are not limited to: silicon, germanium, silicon carbide, carbon doped silicon, compound semiconductors (e.g., comprising elements from periodic table groups III, IV, and/or V), a combination thereof, and/or the like. For instance, the one or more semiconductor substrates 108 can be a bulk silicon wafer and/or a silicon-on-insulator ("SOT") wafer. Additionally, the one or more semiconductor substrates 108 can comprise electronic structures such as isolation wires (not shown). Further, the one or more semiconductor substrates 108 can be characterized by one or more crystalline structures. For example, the one or more semiconductor substrates 108 can comprise silicon <100>, silicon <110>, and/or silicon <111>, as described using Miller indices.

Additionally, one or more first dielectric isolation layers 110 can be positioned between the first ReRAM unit 102, the FET 104, and/or the second ReRAM unit 106 and the one or more semiconductor substrates 108. Example dielectric material that can comprise the one or more first dielectric isolation layers 110 can include, but are not limited to: silicon dioxide, amorphous silicon, silicon nitride, a combination thereof, and/or the like.

Moreover, the one or more FET 1T2R unit cells 100 can comprise a first extrinsic semiconductor layer 112 and a second extrinsic semiconductor layer 114, wherein the first extrinsic semiconductor layer 112 can be separated from the second extrinsic semiconductor layer 114 by second dielectric isolation layer 116. As used herein, the term "extrinsic semiconductor" can refer to a semiconductor material doped with one or more impurities to modify one or more electrical properties of the semiconductor material. For example, a semiconductor material can be doped with one or more impurities having electron acceptor atoms (e.g., boron, aluminum, gallium, indium, a combination thereof, and/or the like) to form an extrinsic semiconductor with a P conductivity type ("P-type semiconductor"). In another example, a semiconductor material can be doped with one or more impurities having electron donor atoms (e.g., phosphorus, arsenic, antimony, bismuth, lithium, a combination thereof, and/or the like) to form an extrinsic semiconductor with an N conductivity type ("N-type semiconductor"). In one or more embodiments, the first extrinsic semiconductor layer 112 and/or the second extrinsic semiconductor layer 114 can have the same and/or substantially the same composition (e.g., as shown in FIG. 1). For instance, the first extrinsic semiconductor layer 112 and/or the second extrinsic semiconductor layer 114 can both be N-type semiconductors formed by doping silicon with phosphorus. In another instance, the first extrinsic semiconductor layer 112 and/or the second extrinsic semiconductor layer 114 can both be P-type semiconductors.

Similarly, the one or more second dielectric isolations layers 116 can have the same and/or substantially the same composition as the one or more first dielectric isolation layers 110 (e.g., as shown in FIG. 1). Further, as shown in FIG. 1, the one or more second dielectric isolations layers 116 can electrically isolate the first extrinsic semiconductor layer 112 from the second extrinsic semiconductor layer 114. Example dielectrics that can comprise the one or more second dielectric isolation layers 116 can include, but are not limited to: silicon dioxide, amorphous silicon, silicon nitride, a combination thereof, and/or the like. For instance, the one or more second dielectric isolation layers 116 can comprise silicon dioxide.

The first ReRAM unit 102 can comprise a first nanosheet stack within the first extrinsic semiconductor layer 112 and/or the second extrinsic semiconductor layer 114. A first portion of the first nanosheet stack can be positioned within the first extrinsic semiconductor layer 112 and can comprise alternating nanosheets of dielectric layers 118 and/or silicon channels 120. A second portion of the first nanosheet stack can be position within the second extrinsic semiconductor layer 114 and comprise alternating nanosheets of silicon channels 120 and/or active device layers 121. The one or more silicon channels 120 can act as current channels to facilitate one or more flows of electrical current. The active device layers 121 can comprise one or more inner spacers 122, one or more gate dielectric layers 124, and/or one or more work function metals 126. For example, one of the active device layers 121 in the second portion of the first nanosheet stack is delineated with dashed lines in FIG. 1.

The one or more nanosheets of dielectric layers 118, the one or more nanosheets of silicon channels 120, and/or the one or more nanosheets of active device layers 121 can have a thickness (e.g., along the "Y" axis shown in FIG. 1) of greater than or equal to 5 nanometers (nm) and less than or equal to 12 nm. Further, the one or more nanosheets of dielectric layers 118, the one or more nanosheets of silicon channels 120, and/or the one or more nanosheets of active device layers 121 can have a width (e.g., along the "X" axis shown in FIG. 1) of greater than or equal to 30 nm and less than or equal to 200 nm. As shown in FIG. 1, the bottom most (e.g., along the "Y" axis shown in FIG. 1) active device layer 121 of the second portion of the first nanosheet stack can have a greater thickness (e.g., along the "Y" axis) than the other active device layers 121 of the second portion.

As shown in FIG. 1, the one or more inner spacers 122 can be located on the sides of the first nanosheet stack so as to be positioned between the one or more work function metals 126 and the second extrinsic semiconductor layer 114. The one or more inner spacers 122 can comprise a dielectric material such as, but not limited to: silicon nitride, silicon dioxide, a combination thereof, and/or the like. Further, the one or more gate dielectric layers 124 can be present on the inner surfaces of the silicon channels 120 and/or the inner spacers 122. The one or more gate dielectric layers 124 can be an oxide, nitride, oxynitride, and/or the like. In one example, the one or more gate dielectric layers 124 can be a high-k dielectric. As used herein, the term "high-k dielectric" can refer to a dielectric material having a dielectric constant greater than silicon dioxide. Example high-k dielectrics can include, but are not limited to: hafnium dioxide ("$HfO_2$"), zirconium dioxide ("$ZrO_2$"), lanthanum oxide ("$La_2O_3$"), aluminum oxide ("$Al_2O_3$"), titanium oxide ("$TiO_2$"), strontium titanate ("$SrTiO_3$"), lanthanum aluminate ("$LaAlO_3$"), yttrium oxide ("$Y_2O_3$"), hafnium oxynitride ("$HfO_xN_y$"), zirconium oxynitride ("$ZrO_xN_y$"), lanthanum oxynitride ("$La_2O_xN_y$"), aluminum oxynitride ("$Al_2O_xN_y$"), titanium oxynitride ("$TiO_xN_y$"), nitrogen doped strontium titanate ("$SrTiO_xN_y$"), nitrogen doped lanthanum aluminate ("$LaAlO_xN_y$"), yttrium oxynitride ("$Y_2O_xN_y$"), silicon oxynitride ("$SiO_xN_y$"), silicon nitride ("$SiN_x$"), a silicate thereof, a combination thereof, and/or the like. Each value of "x" can be independently from 0.5 to 3, and/or each value of "y" can be independently from 0 to 2. In some embodiments, a multilayered gate dielectric structure comprising different gate dielectric materials (e.g., silicon dioxide and/or a high-k gate dielectric) can be formed and used as the one or more gate dielectric layers 124.

The one or more gate dielectric layers 124 can be formed by any deposition process including, but not limited to: chemical vapor deposition ("CVD"), plasma enhanced chemical vapor deposition ("PECVD"), physical vapor deposition ("PVD"), sputtering, atomic layer deposition, a combination thereof, and/or the like. In one or more embodiments the one or more gate dielectric layers 124 can have an exemplary thickness greater than or equal to 1 nm and less than or equal to 10 nm.

The one or more work function metals 126 can have a work function value that matches the conductivity type of the second extrinsic semiconductor layer 114. For example, wherein the second extrinsic semiconductor layer 114 is an N-type semiconductor, the one or more work function metals 126 can also have N-type work function values. Metals that can comprise one or more P-type work function metals 126 can include, but are not limited to: titanium nitride, tantalum nitride, tungsten, a combination thereof, and/or the like. Metals that can comprise one or more N-type work function metals 126 can include, but are not limited to: hafnium, zirconium, titanium, tantalum, aluminum, metal carbides (e.g., hafnium carbide, zirconium carbide, titanium carbide, and/or aluminum carbide), aluminides, a combination thereof, and/or the like. The one or more work function metals 126 can be formed utilizing a deposition process such as, for example, CVD, PECVD, and/or ALD. Also, the one or more work function metals 126 typically can have a thickness greater than or equal to 1 nm and less than or equal to 10 nm.

The presence of the one or more nanosheets of dielectric layers 118 can electrically isolate the first ReRAM unit 102 from the first extrinsic semiconductor layer 112. In contrast, the first ReRAM unit 102 can be in electrical communication with the second extrinsic semiconductor layer 114 via the second portion of the first nanosheet stack.

Further, the first ReRAM unit 102 can comprise a first gate positioned on the first nanosheet stack. The first gate can comprise one or more gate spacers 128, one or more gate dielectric layers 124, one or more active device function metals 126, and/or one or more metal liners 130. As shown in FIG. 1, the one or more gate spacers 128 can be positioned on the sides of the first gate. The one or more gate spacers 128 can comprise a dielectric material. For example, in one or more embodiments, the one or more gate spacers 128 can comprise the same dielectric materials as the one or more inner spacers 122 (e.g., as shown in FIG. 1). The one or more metal liners 130 can comprise one or more metals and/or metal alloys having a lower electrical resistivity than the one or more active device function metals 126 comprising the first nanosheet stack. Example metals that can comprise the one or more metal liners 130 can include, but are not limited to: tungsten, cobalt, aluminum, titanium, a combination thereof, and/or the like.

As shown in FIG. 1, the first ReRAM unit 102 can be in electrical communication with a first word line contact 132. Example materials that can comprise the first word line contact 132 can include, but are not limited to: tungsten, copper, cobalt, a combination thereof, and/or the like. Further, the first word line contact 132 can extend to a first word line (not shown), which can extend along the "X" axis shown in FIG. 1.

The FET 104 can comprise a second nanosheet stack positioned within the first extrinsic semiconductor layer 112 and the second extrinsic semiconductor layer 114. The second nanosheet stack can comprise alternating nanosheets of silicon channels 120 and active device layers 121. For example, one of the active device layers 121 in the second nanosheet stack is delineated with dashed lines in FIG. 1. Similar to the first nanosheet stack, the one or more nanosheets of active device layers 121 comprising the second nanosheet stack can comprise one or more inner spacers 122, one or more gate dielectric layers 124, and/or one or more work function metals 126. As shown in FIG. 1, in one or more embodiments the second nanosheet stack can comprise the same materials described herein with regards to the first nanosheet stack.

Further, the FET 104 can comprise a second gate, which can comprise one or more gate spacers 128, one or more gate dielectric layers 124, one or more work function metals 126, and/or one or more metal liners 130. In one or more embodiments, the second gate can comprise the same materials described herein with regards to the first gate (e.g., as shown in FIG. 1). Additionally, the second gate can be in electrical communication with a gate line 134. The gate line 134 can extend in a direction perpendicular to the "X" axis shown in FIG. 1. Example materials that can comprise the gate line 134 can include, but are not limited to: tungsten, cobalt, copper, a combination thereof, and/or the like.

In contrast to the first nanosheet stack of the first ReRAM unit 102, the second nanosheet stack of the FET 104 can be in electrical communication with both the first extrinsic semiconductor layer 112 and the second extrinsic semiconductor layer 114. In addition, the FET 104 can comprise a first metal contact 136 in electrical communication with a first bit line 138 and a second metal contact 140 in electrical communication with a second bit line 142. The first bit line 138 and the second bit line 142 can extend in a direction perpendicular to the "X" axis shown in FIG. 1. Example materials that can comprise the first bit line 138 and/or the second bit line 142 can include, but are not limited to: tungsten, cobalt, copper, a combination thereof, and/or the like.

As shown in FIG. 1, the first metal contact 136 can be positioned between the second nanosheet stack and the second ReRAM unit 106. Also, the first metal contact 136 can extend from the first bit line 138 into the second extrinsic semiconductor layer 114. Further, the first metal contact 136 can be in electrical communication with the second extrinsic semiconductor layer 114. Example metals that can comprise the first metal contact 136 can include, but are not limited to: tungsten, cobalt, copper, a combination thereof, and/or the like.

As shown in FIG. 1, the second metal contact 140 can be position between the second nanosheet stack and the first ReRAM unit 102. Also, the second metal contact 140 can extend from the second bit line 142, through the second extrinsic semiconductor layer 114, and/or into the first extrinsic semiconductor layer 112. Further, one or more dielectric liners 144 can be positioned on one or more sides of the second metal contact 140 to electrically isolate the second metal contact 140 from the second extrinsic semiconductor layer 114. The one or more dielectric liners 144 can comprise a dielectric material. In one or more embodiments, the one or more dielectric liners 144 can comprise the same material as the one or more inner spacers 122 and/or one or more gate spacers 128 (e.g., as shown in FIG. 1). Additionally, the one or more dielectric liners 144 can have an exemplary thickness greater than or equal to 1 nm and less than or equal to 10 nm. As shown in FIG. 1, a bottom side of the second metal contact 140 can be free of the one or more dielectric liners 144; thereby enabling the second metal contact 140 to be in electrical communication with the first extrinsic semiconductor layer 112. Example metals that can comprise the second metal contact 140 can include, but are not limited to: tungsten, cobalt, copper, a combination thereof, and/or the like. Therefore, the FET 104 can be in electrical communication with both the first extrinsic semiconductor layer 112 and/or the second extrinsic semiconductor layer 114, wherein the first extrinsic semiconductor layer 112 and/or the second extrinsic semiconductor layer 114 can act as source/drain regions for operation of the first ReRAM unit 102 and/or the second ReRAM unit 106.

The second ReRAM unit 106 can comprise a third nanosheet stack positioned within the first extrinsic semiconductor layer 112. The third nanosheet stack can comprise alternating nanosheets of silicon channels 120 and active device layers 121. For example, one of the active device layers 121 in the third nanosheet stack is delineated with dashed lines in FIG. 1. Similar to the active device layers 121 of the first nanosheet stack and/or the second nanosheet stack, the one or more active device layers 121 comprising the third nanosheet stack can comprise one or more inner spacers 122, one or more gate dielectric layers 124, and/or one or more work function metals 126. In one or more embodiments, the third nanosheet layer can comprise the same materials as the second portion of the first nanosheet layer (e.g., as shown in FIG. 1).

The second ReRAM unit 106 can also comprise a third gate positioned above the third nanosheet stack. The third gate can comprise one or more metal liners 130 that can extend from a second word line contact 146, through the second extrinsic semiconductor layer 114, and/or to the third nanosheet stack. As shown in FIG. 1, the third gate can comprise one or more gate spacers 128 and/or one or more inner spacers 122 adjacent to the one or more metal liners 130. In one or more embodiments, the one or more gate spacers 128 and/or one or more inner spacers 122 of the second ReRAM unit 106 can comprise the same materials as the one or more gate spacers 128 and/or inner spacers 122 of the first ReRAM unit 102 and/or FET 104. The one or more inner spacers 122 can electrically isolate the one or more metal liners 130 of the second ReRAM unit 106 from the second extrinsic semiconductor layer 114. Thus, the second ReRAM unit 106 can be electrically isolated from the second extrinsic semiconductor layer 114 and/or in electrical communication with the first extrinsic semiconductor layer 112.

As shown in FIG. 1, the second ReRAM unit 106 can be in electrical communication with a second word line contact 146. Example materials that can comprise the second word line contact 146 can include, but are not limited to: tungsten, cobalt, copper, a combination thereof, and/or the like. Further, the second word line contact 146 can extend to a second word line (not shown), which can extend along the "X" axis shown in FIG. 1.

One of ordinary skill in the art will readily recognize that the number of nanosheets comprising the first nanosheet stack, the second nanosheet stack, and/or the third nanosheet stack is not limited to the number depicted in FIG. 1. Nanosheet stacks comprising fewer or greater nanosheets are also envisaged. Additionally, while FIG. 1 depicts an N-type FET 1T2R unit cell 100 (e.g., comprising an N-type first extrinsic layer 112, an N-type second extrinsic layer 114, and/or N-type work function metals 126), one or more embodiments of a P-type FET 1T2R unit cell 100 are also envisaged.

Figure 2:
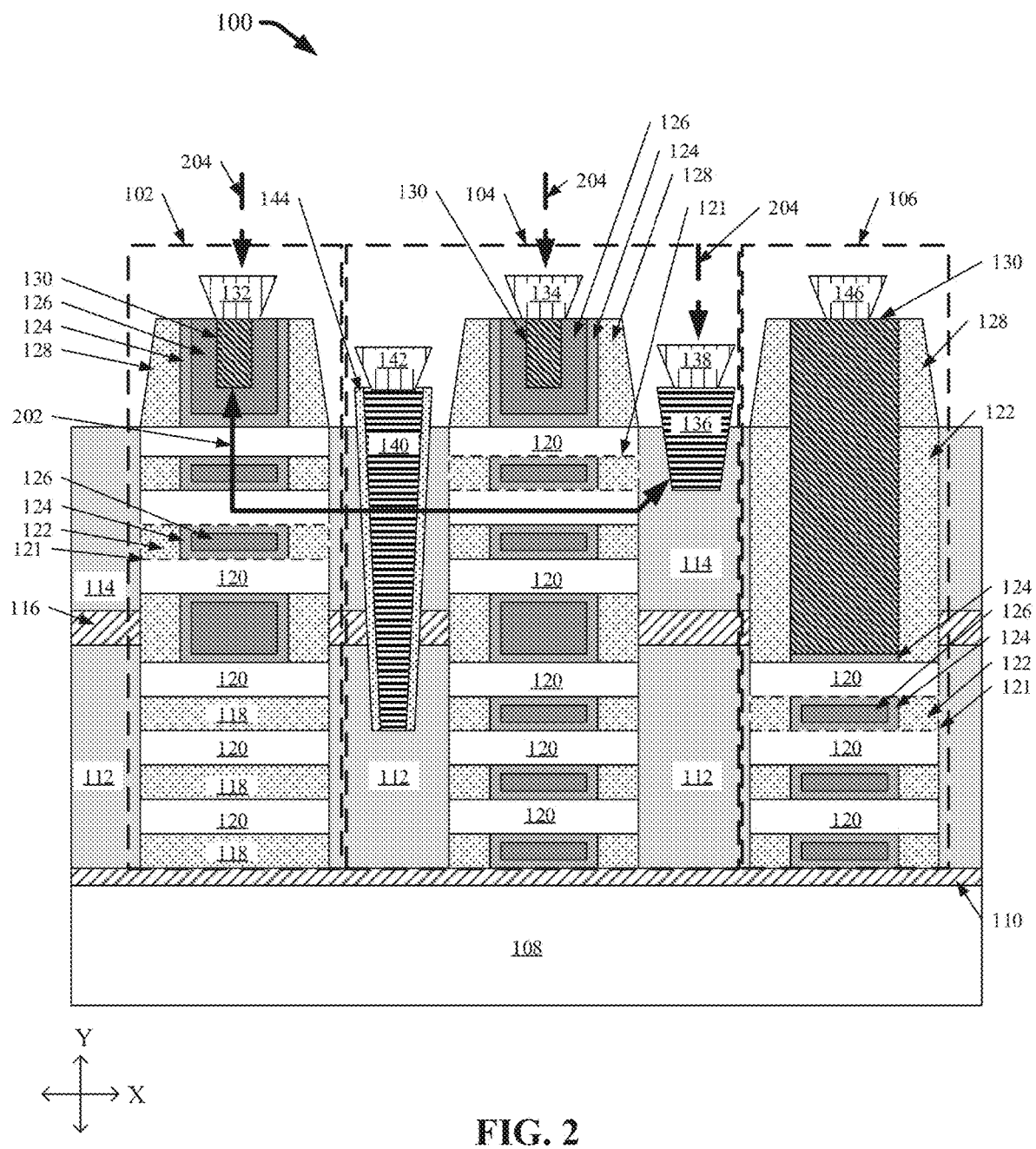
FIG. 2 illustrates a diagram of an example, non-limiting operation of a first resistive random-access memory ("ReRAM") unit comprised within a FET 1T2R unit cell in accordance with one or more embodiments described herein.

FIG. 2 illustrates a diagram of an example, non-limiting first current flow 202 that can facilitate operation of the first ReRAM unit 102 in accordance with one or more embodiments described herein. Repetitive description of like elements employed in other embodiments described herein is omitted for sake of brevity. As shown in FIG. 2, the first current flow 202 can be depicted by a bold line.

Operation of the first ReRAM unit cell 102 can comprise the first current flow 202 extending between the first gate of the first ReRAM unit cell 102 and/or the first metal contact 136. For example, the first current flow 202 can extend through the first gate, through the second portion of the first nanosheet stack, through the second extrinsic semiconductor layer 114, around the second metal contact 140 (e.g., due to the electrical isolation caused by the one or more dielectric liners 144), through the second nanosheet stack, and/or through the first metal contact 136. Thus, the first ReRAM unit cell 102 can facilitate electrical communication between the first word line and the first bit line 138.

As shown in FIG. 2, an electrical bias 204 (e.g., delineated by bold, dashed arrows) can be applied to the first word line contact 132, the gate line 134, and/or the first bit line 138 to facilitate the first current flow 202. Additionally, as shown in FIG. 2, the first current flow 202 traverses through the FET 104; thereby the FET 104 can be used to control the first current flow 202 and/or operation of the first ReRAM unit 102.

Figure 3:
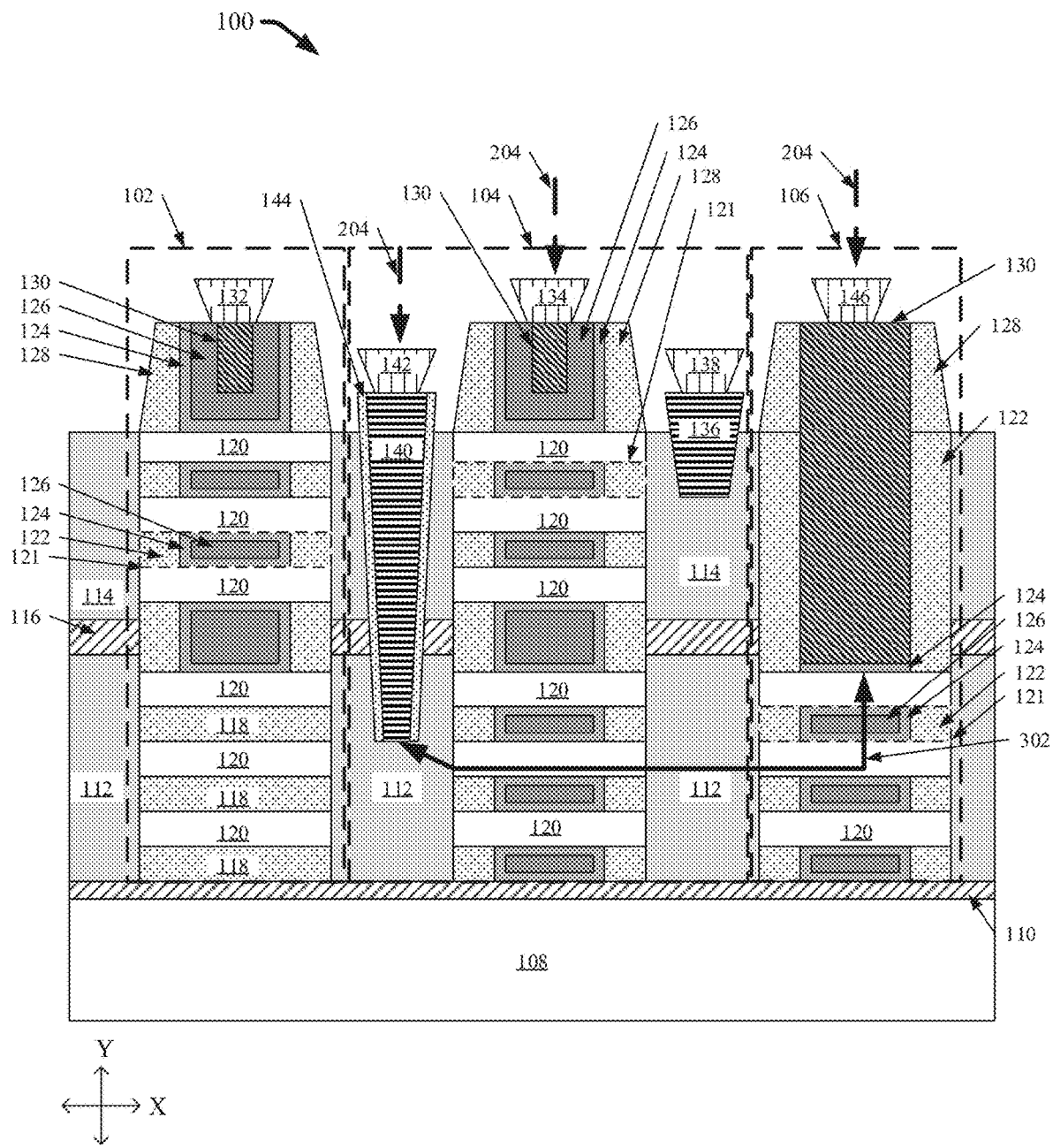
FIG. 3 illustrates a diagram of an example, non-limiting operation of a second ReRAM unit comprised within a FET 1T2R unit cell in accordance with one or more embodiments described herein.

FIG. 3 illustrates a diagram of an example, non-limiting second current flow 302 that can facilitate operation of the second ReRAM unit 106 in accordance with one or more embodiments described herein. Repetitive description of like elements employed in other embodiments described herein is omitted for sake of brevity. As shown in FIG. 3, the second current flow 302 can be depicted by a bold line.

Operation of the second ReRAM unit 106 can comprise the second current flow 302 extending between the third gate of the second ReRAM unit 106 and/or the second metal contact 140. For example, the second current flow 302 can extend through the third gate, through the third nanosheet stack, through the first extrinsic semiconductor layer 112, through the second nanosheet stack, and/or through the second metal contact 140. Thus, the second ReRAM unit 106 can facilitate electrical communication between the second word line and the second bit line 142. Additionally, by isolating the current flows of the two ReRAM units to respective stacked extrinsic semiconductor layers, the FET 1T2R unit cell 100 can minimize the amount of space on the semiconductor substrate 108 needed for operation and/or manufacturing of the ReRAM units.

As shown in FIG. 3, an electrical bias 204 (e.g., delineated by bold, dashed arrows) can be applied to the second word line contact 146, the gate line 134, and/or the second bit line 142 to facilitate the second current flow 302. Additionally, as shown in FIG. 3, the second current flow 302 traverses through the FET 104; thereby the FET 104 can be used to control the second current flow 302 and/or operation of the second ReRAM unit 106.

Figure 4:
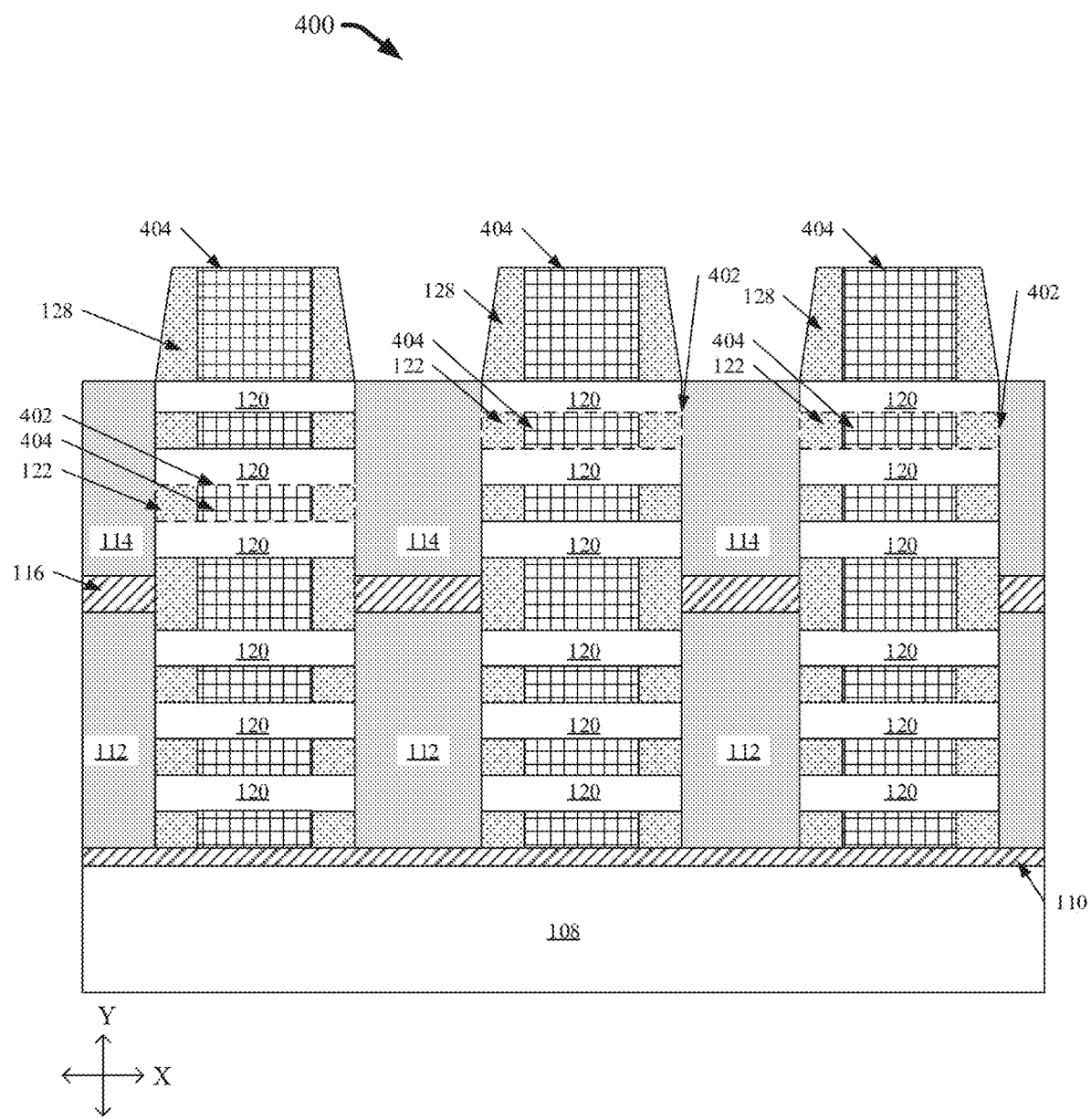
FIG. 4 illustrates a diagram of an example, non-limiting nanosheet structure that can be formed into one or more FET 1T2R unit cells through one or more stages of manufacturing in accordance with one or more embodiments described herein.

FIG. 4 illustrates a diagram of an example, non-limiting stacked nanosheet structure 400 that can used to generate the one or more FET 1T2R unit cells 100 in accordance with one or more embodiments described herein. Repetitive description of like elements employed in other embodiments described herein is omitted for sake of brevity.

As shown in FIG. 4, the stacked nanosheet structure 400 can comprise three sacrificial nanosheet stacks positioned on top of one or more semiconductor substrates 108 and/or one or more first dielectric isolation layers 110. Further the three sacrificial nanosheet stacks can be positioned within the first extrinsic semiconductor layer 112 and/or the second extrinsic semiconductor layer 114. Additionally, the sacrificial three nanosheet stacks can comprise alternating nanosheets of silicon channels 120 and sacrificial layers 402. For example, for each sacrificial nanosheet stack shown in FIG. 4, one of the sacrificial layers 402 is delineated by dashed lines.

The one or more sacrificial layers 402 can comprise one or more inner spacers 122 and/or one or more sacrificial materials 404. The one or more sacrificial materials 404 can comprise materials that can be selectively etched from the one or more silicon channels 120, the one or more inner spacers 122, and/or the one or more gate spacers 128. Example materials that can comprise the sacrificial materials 404 can include, but are not limited to: amorphous silicon, amorphous silicon germanium, polycrystalline silicon, polycrystalline silicon germanium, a combination thereof, and/or the like. Additionally, the stacked nanosheet structure 400 can comprise three sacrificial gates positioned on top of the three sacrificial nanosheet stacks. As shown in FIG. 4, each of the sacrificial gates can comprise one or more gate spacers 128 and/or one or more sacrificial materials 404.

Figure 5:
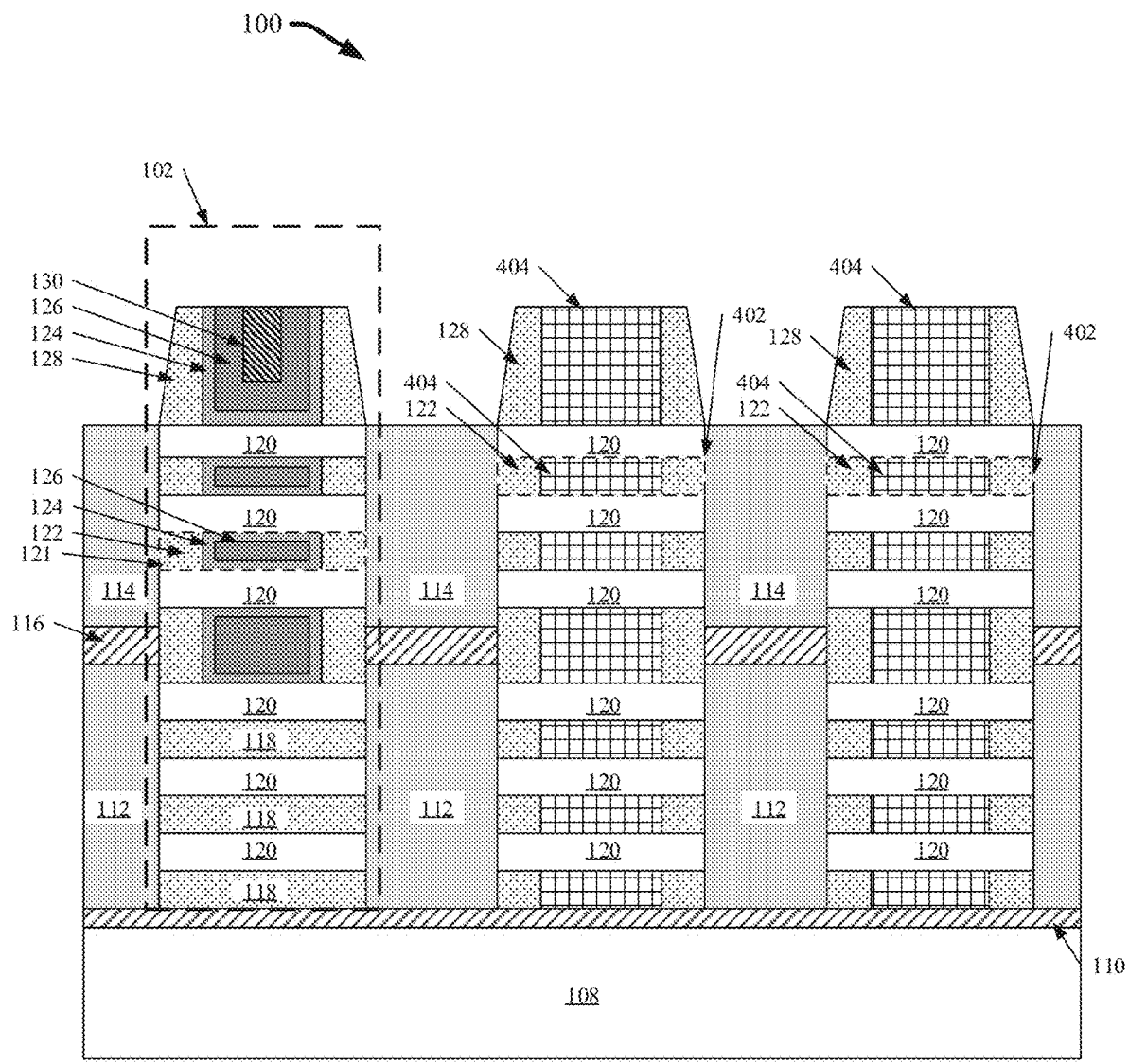
FIG. 5 illustrates a diagram of an example, non-limiting first stage of manufacturing one or more FET 1T2R unit cell in accordance with one or more embodiments described herein.

FIG. 5 illustrates a diagram of an example, non-limiting first stage of manufacturing one or more FET 1T2R unit cells 100 in accordance with one or more embodiments described herein. Repetitive description of like elements employed in other embodiments described herein is omitted for sake of brevity. As shown in FIG. 5, one of the sacrificial nanosheet stacks of the stacked nanosheet structure 400 can be modified in the first stage of manufacturing to facilitate manufacturing of the first ReRAM unit 102.

During the first stage of manufacturing, the second and/or third sacrificial nanosheet stacks of the stacked nanosheet structure 400 can be covered by one or more hard marks. Subsequently, the one or more sacrificial materials 404 of the first sacrificial nanosheet stack can be removed via one or more etch processes. Example etch processes that can facilitate removal of the one or more sacrificial materials 404 can include, but are not limited to: reactive ion etching ("RIE"), wet etching, a combination thereof, and/or the like. Removal of the one or more sacrificial materials 404 can create one or more cavities in the one or more sacrificial layers 402.

The cavities of sacrificial layers 402 positioned in the first extrinsic semiconductor layer 112 can then be filled with one or more dielectric materials to form the one or more nanosheets of dielectric layers 118. Further, the cavities of sacrificial layers 402 positioned in the second extrinsic semiconductor layer 114 can be filled with one or more gate dielectric layers 124 and/or one or more work function metals 126 to form the one or more active device layers 121. Example deposition methods that can facilitate filling the one or more cavities can include but are not limited to: CVD, PECVD, PVD, atomic layer deposition ("ALD"), a combination thereof, and/or the like.

Additionally, the one or more sacrificial materials 404 comprised within the first sacrificial gate can be removed during the first stage of manufacturing. Removal of the one or more sacrificial materials 404 from the first sacrificial gate can leave a cavity that can be filled with one or more gate dielectric layers 124, one or more work function metals 126, and/or one or more metal liners 130 to form the first gate of the first ReRAM unit 102. Example deposition methods that can facilitate filling the one or more cavities can include but are not limited to: CVD, PECVD, PVD, ALD, a combination thereof, and/or the like. Further, the first gate can be planarized (e.g., using one or more chemical-mechanical planarization ("CMP") processes).

Figure 6:
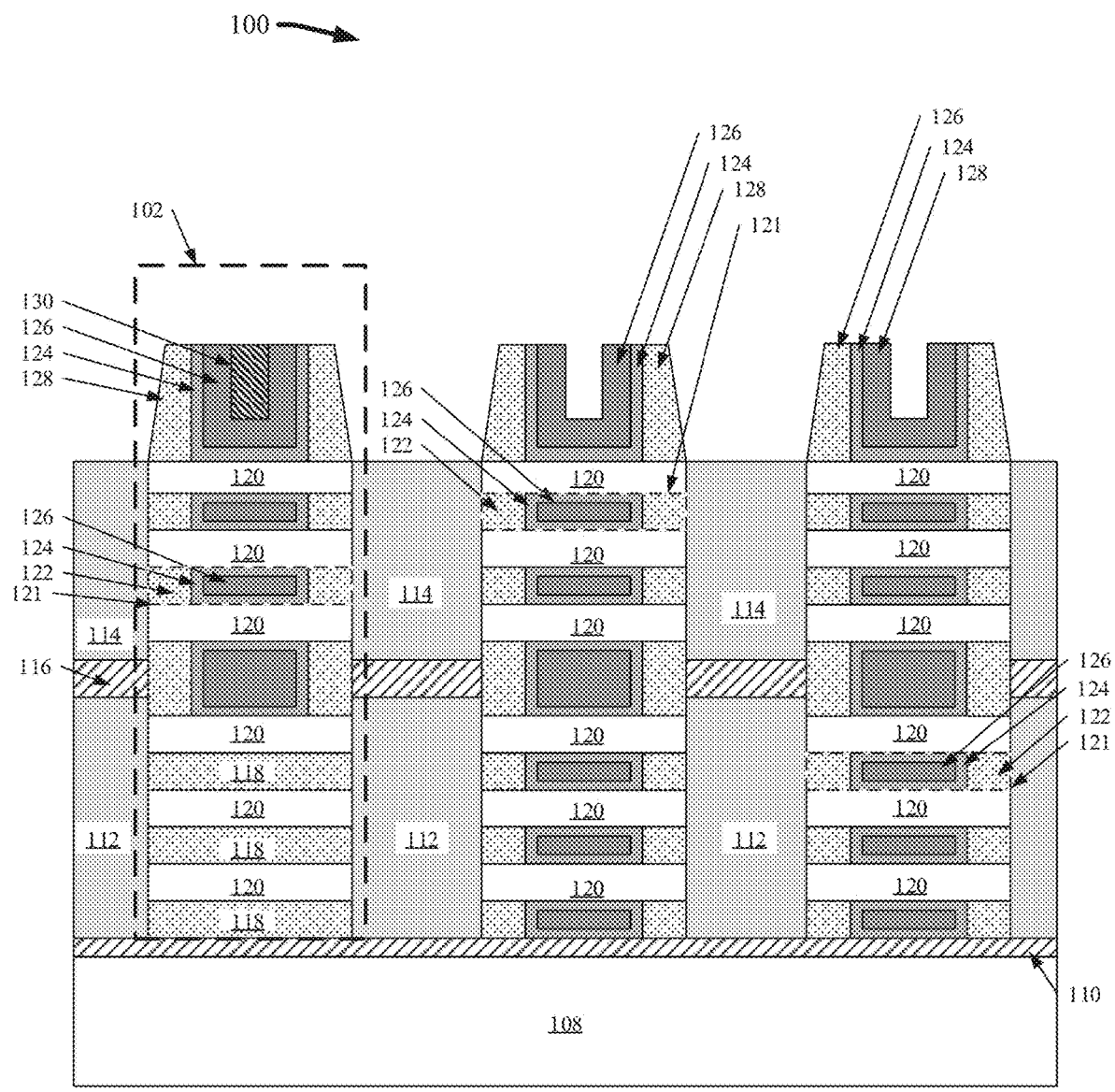
FIG. 6 illustrates a diagram of an example, non-limiting second stage of manufacturing one or more FET 1T2R unit cell in accordance with one or more embodiments described herein.

FIG. 6 illustrates a diagram of an example, non-limiting second stage of manufacturing one or more FET 1T2R unit cells 100 in accordance with one or more embodiments described herein. Repetitive description of like elements employed in other embodiments described herein is omitted for sake of brevity. As shown in FIG. 6, two of the sacrificial nanosheet stacks of the stacked nanosheet structure 400 can be modified in the second stage of manufacturing to facilitate manufacturing of the FET 104 and/or the second ReRAM unit 106.

During the second stage of manufacturing, the first nanosheet stack of the stacked nanosheet structure 400 can be covered by a hard mark. Subsequently, the one or more sacrificial materials 404 of the second sacrificial nanosheet stack and/or the third sacrificial nanosheet stack can be removed via one or more etch processes. Example etch processes that can facilitate removal of the one or more sacrificial materials 404 can include, but are not limited to: reactive ion etching ("RIE"), wet etching, a combination thereof, and/or the like. Removal of the one or more sacrificial materials 404 can create one or more cavities in the one or more sacrificial layers 402 of the second sacrificial nanosheet stack and/or third sacrificial nanosheet stack.

The cavities of sacrificial layers 402 can be filled with one or more gate dielectric layers 124 and/or one or more work function metals 126 to form the one or more active device layers 121 in the second nanosheet stack of the FET 104 and/or the third nanosheet stack of the second ReRAM unit 106. Example deposition methods that can facilitate filling the one or more cavities can include but are not limited to: CVD, PECVD, PVD, ALD, a combination thereof, and/or the like.

Additionally, the one or more sacrificial materials 404 comprised within the second sacrificial gate and/or the third sacrificial gate can be removed during the second stage of manufacturing. Removal of the one or more sacrificial materials 404 from the second sacrificial gate and/or third sacrificial gate can leave one or more cavities that can be filled with one or more gate dielectric layers 124 and/or one or more work function metals 126 to facilitate formation of the second gate of the FET 104 and/or the third gate of the second ReRAM unit 106. Example deposition methods that can facilitate filling the one or more cavities can include but are not limited to: CVD, PECVD, PVD, ALD, a combination thereof, and/or the like. Further, the first gate can be planarized (e.g., using one or more chemical-mechanical planarization ("CMP") processes).

Figure 7:
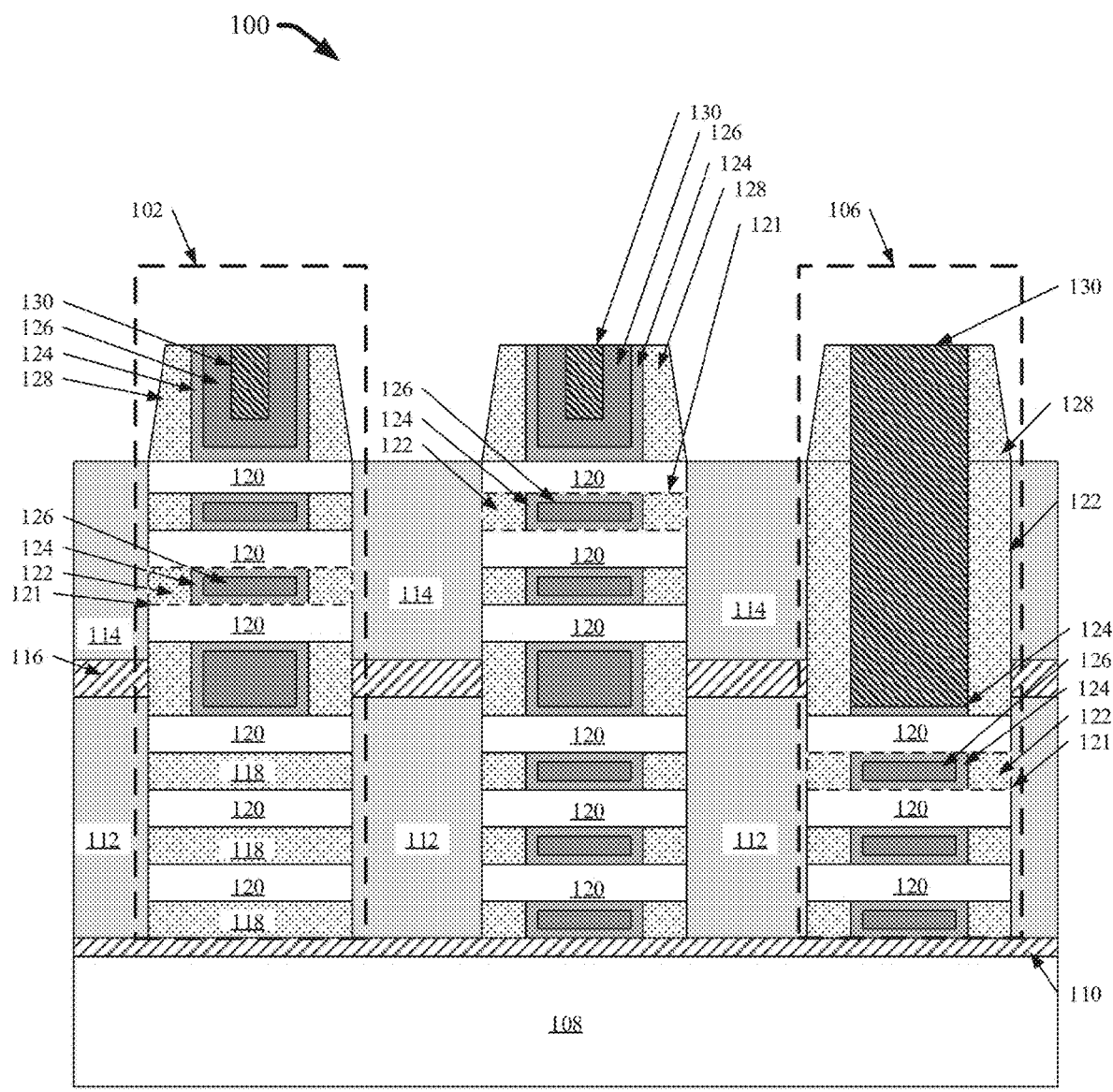
FIG. 7 illustrates a diagram of an example, non-limiting third stage of manufacturing one or more FET 1T2R unit cell in accordance with one or more embodiments described herein.

FIG. 7 illustrates a diagram of an example, non-limiting third stage of manufacturing one or more FET 1T2R unit cells 100 in accordance with one or more embodiments described herein. Repetitive description of like elements employed in other embodiments described herein is omitted for sake of brevity.

During the third stage of manufacturing, the one or more gate dielectric layers 124 and/or the one or more work function metals 126 can be removed from the third gate and/or the one or more active device layers 121 of the third nanosheet stack that are positioned within the second extrinsic semiconductor layer 114. Additionally, the one or more silicon channels 120 can removed from a portion of the third nanosheet stack positioned within the second extrinsic semiconductor layer 114. Example etching processes that can facilitate removal of the one or more gate dielectric layers 124, one or more work function metals 126, and/or one or more silicon channels 120 can include, but are not limited to: RIE, wet etching, a combination thereof, and/or the like. Removal of the one or more silicon channels 120 can result in one or more cavities in the third nanosheet stack that can be partially filled with one or more dielectric materials to form one or more large inner spacers 122, which can extend through the thickness of the second extrinsic semiconductor layer 114.

After formation of the one or more large inner spacers 122, the remaining one or more cavities caused by removal of the silicon channels 120, the one or more gate dielectric layers 124, and/or the one or more work function metals 126 can be filled with one or more metal liners 130. As shown in FIG. 7, depositing the one or more metal liners 130 into the one or more cavities of the third nanosheet stack can form the third gate, which can extend through the second extrinsic semiconductor layer 114 and into the first extrinsic semiconductor layer 112. Additionally, the one or more large inner spacers 122 can electrically isolate the third gate from the second extrinsic semiconductor layer 114.

Further, one or more metal liners 130 can be deposited into the second gate of the FET 104. Moreover, the second gate and/or the third gate can be planarized (e.g., using one or more chemical-mechanical planarization ("CMP") processes). Example, deposition processes to facilitate depositing the one or more dielectric materials and/or one or more metal liners 130 in the third stage of manufacturing can include, but are not limited to: CVD, PECVD, PVD, ALD, a combination thereof, and/or the like.

Figure 8:
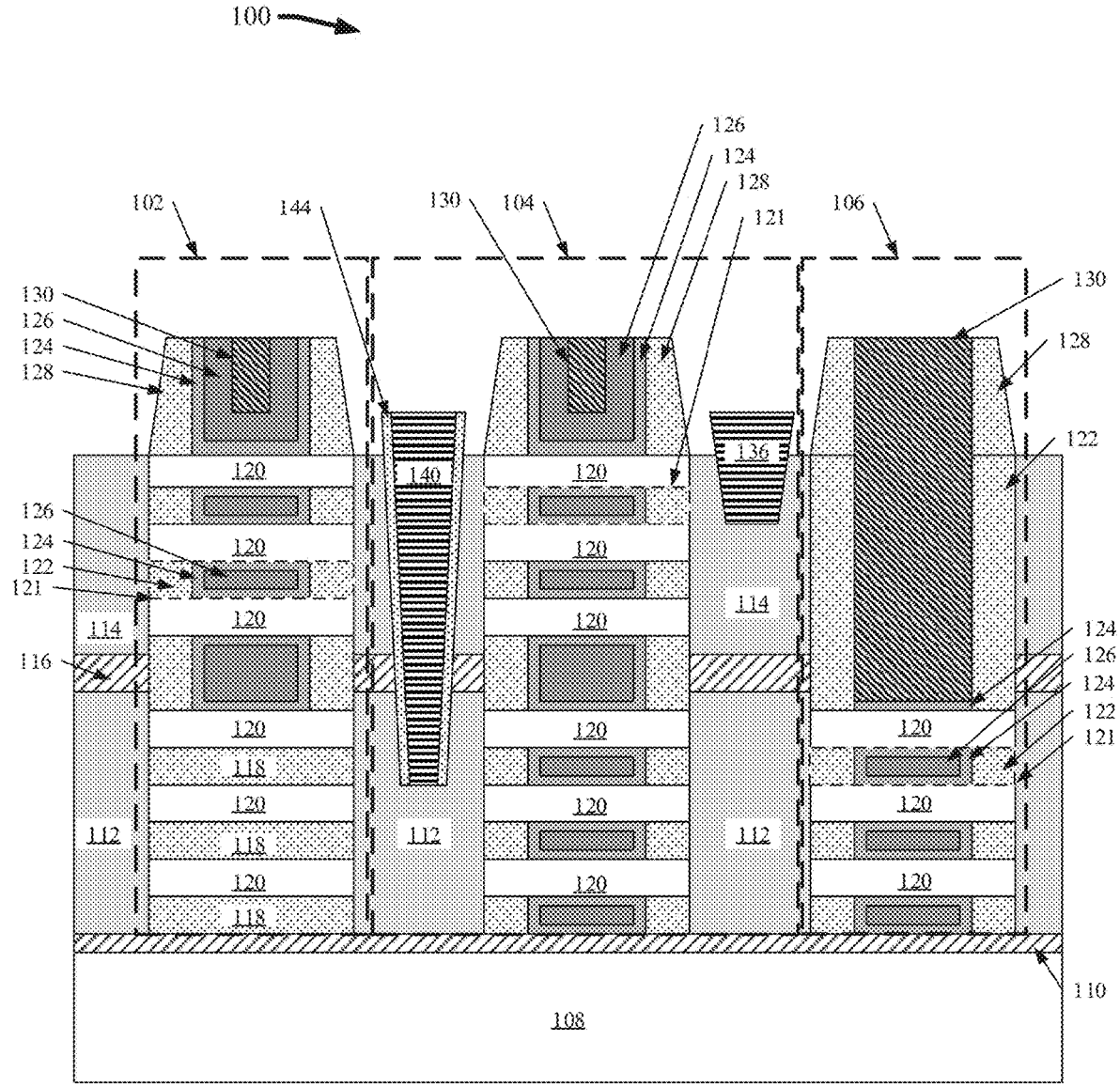
FIG. 8 illustrates a diagram of an example, non-limiting third stage of manufacturing one or more FET 1T2R unit cell in accordance with one or more embodiments described herein.

FIG. 8 illustrates a diagram of an example, non-limiting fourth stage of manufacturing one or more FET 1T2R unit cells 100 in accordance with one or more embodiments described herein. Repetitive description of like elements employed in other embodiments described herein is omitted for sake of brevity. As shown in FIG. 8, the first metal contact 136 and/or the second metal contact 140 can be formed in the fourth stage of manufacturing.

During the fourth stage of manufacturing, a first through silicon vias ("TVS") can be formed within the second extrinsic semiconductor layer 114 between the FET 104 and the second ReRAM unit 106. Subsequently, one or more metals can be deposited into the first TVS to form the first metal contact 136. Additionally, a second TVS can be formed that can extend through the second extrinsic semiconductor layer 114, the second dielectric isolation layer 116, and/or into the first extrinsic semiconductor layer 112. Subsequently, the second TVS can be partially filled with one or more dielectric materials to form one or more dielectric liners 144 on one or more sides of the second TVS. In one or more embodiments, the one or more dielectric materials can be deposited on the left and/or right sides of the second TVS but not the bottom of the TVS (e.g., as shown in FIG. 8). Further, the remaining cavity in the second TVS can be filled with one or more metals to form the second metal contact 140. As described herein, formation of the one or more dielectric liners 144 can electrically isolate the second metal contact 140 from the second extrinsic semiconductor layer 114. Example etching processes that can facilitate formation of the first TVS and/or the second TVS can include, but are not limited to: RIE, wet etching, a combination thereof, and/or the like. In one or more embodiments, the FET 1T2R unit cell 100 depicted in FIG. 8 can further be operably coupled to a first word line contact 132, a gate line 134, a first bit line 138, the second bit line 142, and/or a second word line contact 146 as shown in FIG. 1.

Figure 9:
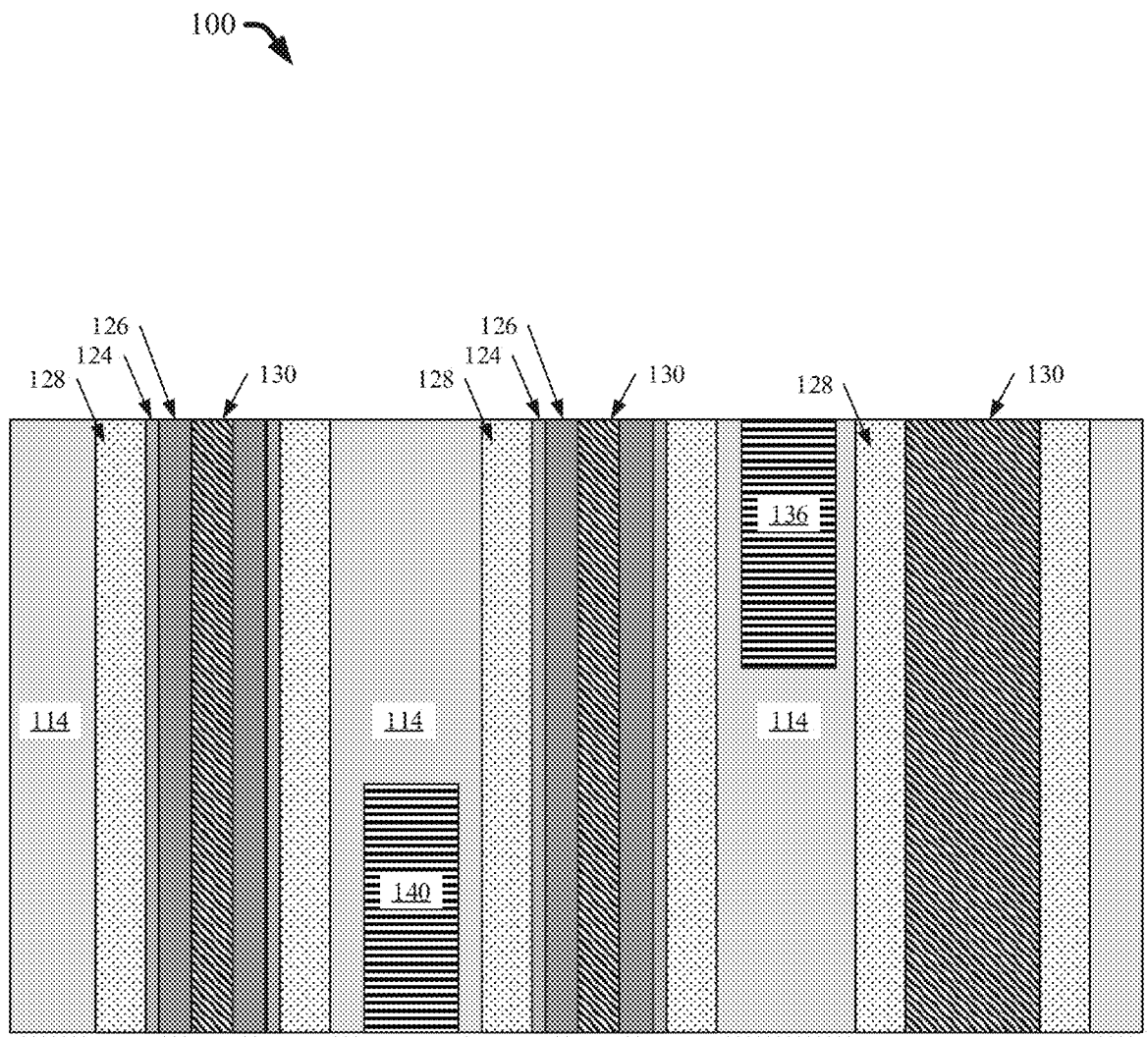
FIG. 9 illustrates a diagram of an example, non-limiting top-down view of a FET 1T2R unit cell after a fourth stage of manufacturing in accordance with one or more embodiments described herein.

FIG. 9 illustrates a diagram an example, non-limiting top-down view of the FET 1T2R unit cell 100 after the fourth stage of manufacturing in accordance with one or more embodiments described herein. Repetitive description of like elements employed in other embodiments described herein is omitted for sake of brevity. As shown in FIG. 9, the first metal contact 136 can be formed at a back portion of the FET 1T2R unit cell 100 and/or the second metal contact 140 can be formed at a front portion of the FET 1T2R unit cell 100.

Figure 10:
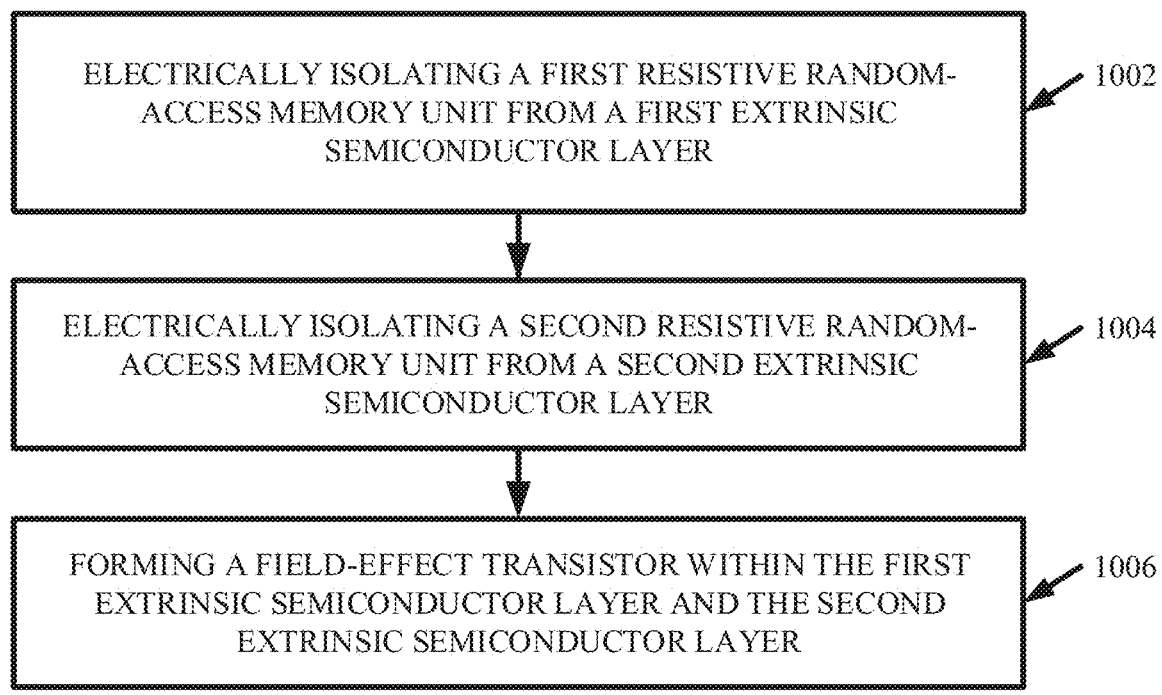
FIG. 10 illustrates a flow diagram of an example, non-limiting method that can facilitate manufacturing one or more FET 1T2R unit cells in accordance with one or more embodiments described herein.

FIG. 10 illustrates a flow diagram of an example, non-limiting method 1000 that can facilitate manufacturing of one or more FET 1T2R unit cells 100 in accordance with one or more embodiments described herein. Repetitive description of like elements employed in other embodiments described herein is omitted for sake of brevity.

At 1002, the method 1000 can comprise electrically isolating a first ReRAM unit 102 from a first extrinsic semiconductor layer 112. For example, the isolating at 1002 can be performed in accordance with the first stage of manufacturing described herein. For instance, the first ReRAM unit 102 can comprise a first nanosheet stack, and/or electrically isolating a first ReRAM unit 102 from a first extrinsic semiconductor layer 112 can comprise replacing one or more nanosheets of the first nanosheet stack with one or more dielectric materials to form one or more dielectric layers 118. Further, the one or more nanosheets that can be formed into the one or more dielectric layers 118 can be nanosheets positioned within the first extrinsic semiconductor layer 112.

At 1004, the method 1000 can comprise electrically isolating a second ReRAM unit 106 from a second extrinsic semiconductor layer 114. For example, the isolating at 1004 can be performed in accordance with the third stage of manufacturing described herein. For instance, the second ReRAM unit 106 can comprise the third nanosheet stack described herein, and/or electrically isolating a second ReRAM unit 106 from a second extrinsic semiconductor layer 114 can comprise replacing one or more nanosheets of the third nanosheet stack with one or more metal liners 130 insulated from the second extrinsic semiconductor layer 114 by one or more inner spacers 122. Further, the one or more nanosheets that can be formed into the insulated one or more metal liners 130 can be nanosheets positioned within the second extrinsic semiconductor layer 114.

At 1006, the method 1000 can comprise forming a FET 104 within the first extrinsic semiconductor layer 112 and/or the second extrinsic semiconductor layer 114. For example, the forming at 1006 can be performed in accordance with the second, third, and/or fourth stages of manufacturing described herein. For instance, the FET 104 can comprise the second nanosheet stack described herein, which can extend through the second extrinsic semiconductor layer 114 and/or the first extrinsic semiconductor layer 112. Additionally, the forming at 1006 can comprise forming a first metal contact 136 that can be in electrical communication with the second extrinsic semiconductor layer 114 and/or a second metal contact 140 that can be in electrical communication with the first extrinsic semiconductor layer 112. The FET 104 can control operation of the first ReRAM unit 102 and/or the second ReRAM unit 106 by controlling a first current flow 202 through the second extrinsic semiconductor layer 114 (e.g., to control the first ReRAM unit 102) and/or a second current flow 302 through the first extrinsic semiconductor layer 112 (e.g., to control the second ReRAM unit 106) as shown in FIGS. 2 and 3 and/or described herein. Moreover, the FET 104 can control operation of the first ReRAM unit 102 and/or the second ReRAM unit 106 independent of each other.

FIG. 11 illustrates a flow diagram of an example, non-limiting method 1100 that can facilitate manufacturing of one or more FET 1T2R unit cells 100 in accordance with one or more embodiments described herein. Repetitive description of like elements employed in other embodiments described herein is omitted for sake of brevity.

At 1102, the method 1100 can comprise forming a first ReRAM unit 102 from a stack of nanosheet layers. For example, the forming at 1102 can be performed in accordance with the first stage of manufacturing described herein. For example, a stacked nanosheet structure 400 can be modified to form the first ReRAM unit 102. For instance, one or more nanosheets of sacrificial layers 402 of a first sacrificial nanosheet stack can be replaced with active device layers 121 and/or dielectric layers 118 as described herein. For example, one or more sacrificial layers 402 positioned within the second extrinsic semiconductor layer 114 can be replaced with one or more active device layers 121 to form the second portion of the first nanosheet stack described herein. Replacing the one or more sacrificial layers 402 can comprise removing one or more sacrificial materials 404 and/or filling the resulting cavities with one or more gate dielectric layers 124 and/or work function metals 126. Additionally, the forming at 1102 can comprise forming the first gate of the first ReRAM unit 102 from the first sacrificial gate of the stacked nanosheet structure 400 described herein.

At 1104, the method 1100 can comprise electrically isolating the first ReRAM unit 102 from a first extrinsic semiconductor layer 112. For example, the isolating at 1104 can be performed in accordance with the first stage of manufacturing described herein. For instance, electrically isolating a first ReRAM unit 102 from a first extrinsic semiconductor layer 112 can comprise replacing one or more sacrificial layers 402 of the first sacrificial nanosheet stack with one or more dielectric materials to form one or more dielectric layers 118 to form the first portion of the first nanosheet stack described herein. Further, the one or more sacrificial layers 402 that can be formed into the one or more dielectric layers 118 can be sacrificial layers 402 positioned within the first extrinsic semiconductor layer 112.

At 1106, the method 1100 can comprise forming a second ReRAM unit 106 from a second stack of nanosheet layers. For example, the forming at 1106 can be performed in accordance with the second and/or third stages of manufacturing described herein. For instance, one or more nanosheets of sacrificial layers 402 of another sacrificial nanosheet stack can be replaced with active device layers 121 to form the third nanosheet stack as described herein. Replacing the one or more sacrificial layers 402 can comprise removing one or more sacrificial materials 404 and/or filling the resulting cavities with one or more gate dielectric layers 124 and/or work function metals 126.

At 1108, the method 1100 can comprise electrically isolating a second ReRAM unit 106 from a second extrinsic semiconductor layer 114. For example, the isolating at 1108 can be performed in accordance with the third stage of manufacturing described herein. For instance, electrically isolating a second ReRAM unit 106 from a second extrinsic semiconductor layer 114 can comprise replacing one or more nanosheets of the third nanosheet stack with one or more metal liners 130 insulated from the second extrinsic semiconductor layer 114 by one or more inner spacers 122. Further, the one or more nanosheets that can be formed into the insulated one or more metal liners 130 can be nanosheets positioned within the second extrinsic semiconductor layer 114. Additionally, the isolating at 1108 can form the third gate described herein.

At 1110, the method 1100 can comprise forming a FET 104 within the first extrinsic semiconductor layer 112 and/or the second extrinsic semiconductor layer 114. For example, the forming at 1110 can be performed in accordance with the second, third, and/or fourth stages of manufacturing described herein. For instance, the FET 104 can comprise the second nanosheet stack described herein, which can extend through the second extrinsic semiconductor layer 114 and/or the first extrinsic semiconductor layer 112. In one or more embodiments, one or more nanosheets of sacrificial layers 402 of a further sacrificial nanosheet stack can be replaced with active device layers 121 to form the second nanosheet stack as described herein Additionally, the forming at 1110 can comprise forming a first metal contact 136 that can be in electrical communication with the second extrinsic semiconductor layer 114 and/or a second metal contact 140 that can be in electrical communication with the first extrinsic semiconductor layer 112. The FET 104 can control operation of the first ReRAM unit 102 and/or the second ReRAM unit 106 by controlling a first current flow 202 through the second extrinsic semiconductor layer 114 (e.g., to control the first ReRAM unit 102) and/or a second current flow 302 through the first extrinsic semiconductor layer 112 (e.g., to control the second ReRAM unit 106) as shown in FIGS. 2 and 3 and/or described herein. Moreover, the FET 104 can control operation of the first ReRAM unit 102 and/or the second ReRAM unit 106 independent of each other.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a first resistive random-access memory unit operably coupled to a field-effect transistor by a first extrinsic semiconductor layer; and
    a second resistive random-access memory unit operably coupled to the field-effect transistor by a second extrinsic semiconductor layer.

2. The system of claim 1, further comprising:
    a dielectric isolation layer positioned between the first extrinsic semiconductor layer and the second extrinsic semiconductor layer.

3. The system of claim 2, wherein the first resistive random-access memory unit is a first nanosheet resistive random-access memory unit, wherein the second resistive random-access memory unit is a second nanosheet resistive random-access memory unit, and wherein the field-effect transistor is a nanosheet field-effect transistor.

4. The system of claim 3, further comprising:
    a first metal contact positioned between the first resistive random-access memory unit and the field-effect transistor, wherein the second resistive random-access memory unit is in electrical communication with the first metal contact; and
    a second metal contact positioned between the second resistive random-access memory unit and the field-effect transistor, wherein the first resistive random-access memory unit is in electrical communication with the second metal contact.

5. The system of claim 4, wherein the field-effect transistor controls operation of the first resistive random-access memory unit and operation of the second resistive random-access memory unit independently.

6. The system of claim 1, wherein the first resistive random-access memory unit comprises a first stack of channels that are in electrical communication with the first extrinsic semiconductor layer and extend from a gate of the first resistive random-access memory unit, and wherein the second resistive random-access memory unit comprises a second stack of channels that are in electrical communication with the second extrinsic semiconductor layer and extend from a gate of the second resistive random-access memory unit.

7. The system of claim 1, wherein the first resistive random-access memory unit, the field-effect transistor, and the second resistive random-access memory unit collectively form a resistive memory device serving as a synapse between a pre-neuron and a post-neuron in a neuromorphic computing application.

8. An apparatus, comprising:
    a first resistive random-access memory unit positioned on a semiconductor substrate and adjacent a first side of a field-effect transistor, wherein the field-effect transistor controls electrical communication between the first resistive random-access memory unit and a first metal contact; and
    a second resistive random-access memory unit positioned on the semiconductor substrate and adjacent to a second side of the field-effect transistor, wherein the field-effect transistor controls electrical communication between the second resistive random-access memory unit and a second metal contact.

9. The apparatus of claim 8, wherein the first metal contact is positioned between the field-effect transistor and the second resistive random-access memory unit, and wherein the second metal contact is positioned between the field-effect transistor and the first resistive random-access memory unit.

10. The apparatus of claim 8, further comprising:
    a first extrinsic semiconductor layer and a second extrinsic semiconductor layer separated by a dielectric isolation layer, wherein the field-effect transistor is capable of directing a first current flow through the first extrinsic semiconductor layer to control the electrical communication between the first resistive random-access memory unit and the first metal contact, and wherein the field-effect transistor is capable of directing a second current flow through the second extrinsic semiconductor layer to control the electrical communication between the second resistive random-access memory unit and the second metal contact.

11. The apparatus of claim 10, wherein the first metal contact is comprised within the first extrinsic semiconductor layer, and wherein the second metal contact extends through the first extrinsic semiconductor layer and the dielectric isolation layer into the second extrinsic semiconductor layer.

12. The apparatus of claim 10, wherein the first resistive random-access memory unit comprises a first stack of channels that are in electrical communication with the first extrinsic semiconductor layer and extend from a gate of the first resistive random-access memory unit, and wherein the second resistive random-access memory unit comprises a second stack of channels that are in electrical communication with the second extrinsic semiconductor layer and extend from a gate of the second resistive random-access memory unit.

13. The apparatus of claim 8, wherein the apparatus is a resistive memory device serving as a synapse between a pre-neuron and a post-neuron in a neuromorphic computing application.

14. A method, comprising:
    electrically isolating a first resistive random-access memory unit from a first extrinsic semiconductor layer;
    electrically isolating a second resistive random-access memory unit from a second extrinsic semiconductor layer; and
    forming a field-effect transistor within the first extrinsic semiconductor layer and the second extrinsic semiconductor layer.

15. The method of claim 14, wherein the field-effect transistor controls a first operation of the first resistive random-access memory unit and a second operation of the second resistive random-access memory unit.

16. The method of claim 15, wherein the field-effect transistor controls the first operation independent of the second operation.

17. The method of claim 14, further comprising:
forming the first resistive random-access memory unit from a stack of nanosheet layers, wherein the electrically isolating the first resistive random-access memory unit comprises replacing a sacrificial nanosheet layer of the stack of nanosheet layers with a dielectric material, wherein the sacrificial nanosheet layer is at a position within the first extrinsic semiconductor layer.

18. The method of claim 17, further comprising:
forming the second resistive random-access memory unit from a second stack of nanosheet layers, wherein the electrically isolating the second resistive random-access memory unit comprises removing a second nanosheet layer of the second stack of nanosheet layers from a second position within the second extrinsic semiconductor layer, and wherein the second nanosheet layer is a second current channel for the second resistive random-access memory unit.

19. The method of claim 18, wherein the electrically isolating the second resistive random-access memory unit further comprises filling the second position with an electrode located between two dielectric isolation layers.

* * * * *